US009624593B2

(12) United States Patent
Sun et al.

(10) Patent No.: US 9,624,593 B2
(45) Date of Patent: Apr. 18, 2017

(54) ANODIZATION ARCHITECTURE FOR ELECTRO-PLATE ADHESION

(71) Applicant: Applied Materials, Inc., Santa Clara, CA (US)

(72) Inventors: Jennifer Y. Sun, Mountain View, CA (US); Biraja P. Kanungo, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 49 days.

(21) Appl. No.: 14/463,001

(22) Filed: Aug. 19, 2014

(65) Prior Publication Data

US 2015/0064450 A1    Mar. 5, 2015

Related U.S. Application Data

(60) Provisional application No. 61/871,807, filed on Aug. 29, 2013.

(51) Int. Cl.
| | |
|---|---|
| *C23C 28/00* | (2006.01) |
| *C25D 5/00* | (2006.01) |
| *C25D 5/48* | (2006.01) |
| *C25D 5/50* | (2006.01) |
| *C25D 11/12* | (2006.01) |
| *C25D 11/20* | (2006.01) |
| *C25D 5/44* | (2006.01) |

(Continued)

(52) U.S. Cl.
CPC ............... *C25D 11/12* (2013.01); *C25D 5/44* (2013.01); *C25D 11/04* (2013.01); *C25D 11/20* (2013.01); *C25D 11/02* (2013.01); *C25D 11/08* (2013.01); *Y10T 428/26* (2015.01); *Y10T 428/263* (2015.01); *Y10T 428/264* (2015.01)

(58) Field of Classification Search
CPC ......... C23C 28/00; C23C 28/30; C23C 28/32; C23C 28/345; C23C 28/3455; C25D 5/34; C25D 5/50; C25D 11/02; C25D 11/34
USPC .......................... 205/171, 199, 220, 224, 229
See application file for complete search history.

(56) References Cited

U.S. PATENT DOCUMENTS 3,969,195 A * 7/1976 Dotzer ..................... C10M 7/00
                                                         205/103
4,465,561 A    8/1984 Nguyen et al.
(Continued)

FOREIGN PATENT DOCUMENTS

DE        10248118 A1     4/2004
JP        05129467 A  *  5/1993  ............. H01L 23/14
(Continued)

OTHER PUBLICATIONS

Tan et al., "High Aspect Ratio Microstructures on Porous Anodic Aluminum Oxide," IEEE (© no month, 1995), pp. 267-272.*
(Continued)

*Primary Examiner* — Edna Wong
(74) *Attorney, Agent, or Firm* — Lowenstein Sandler LLP

(57) ABSTRACT

To manufacture a chamber component for a processing chamber a first anodization layer is formed on a metallic article with impurities, the first anodization layer having a thickness greater than about 100 nm, and an aluminum coating is formed on the first anodization layer, the aluminum coating being substantially free from impurities. A second anodization layer can be formed on the aluminum coating.

19 Claims, 5 Drawing Sheets

(51) Int. Cl.
*C25D 11/04* (2006.01)
*C25D 11/02* (2006.01)
*C25D 11/08* (2006.01)

(56) References Cited

U.S. PATENT DOCUMENTS

| | | | |
|---|---|---|---|
| 4,624,752 A * | 11/1986 | Arrowsmith | C25D 11/24 156/151 |
| 4,883,541 A | 11/1989 | Tadros | |
| 4,948,475 A | 8/1990 | Doetzer et al. | |
| 5,104,514 A * | 4/1992 | Quartarone | C25D 11/246 205/201 |
| 6,776,873 B1 * | 8/2004 | Sun | C23C 16/4404 118/723 R |
| 8,591,986 B1 | 11/2013 | Ajdelsztajn et al. | |
| 9,123,651 B2 | 9/2015 | Shih et al. | |
| 2003/0047464 A1 * | 3/2003 | Sun | C23C 16/4404 205/646 |
| 2004/0124280 A1 | 7/2004 | Shih et al. | |
| 2004/0126499 A1 | 7/2004 | Heinrich et al. | |
| 2004/0137299 A1 | 7/2004 | Mazza et al. | |
| 2004/0221959 A1 | 11/2004 | Choi et al. | |
| 2006/0019035 A1 | 1/2006 | Munz et al. | |
| 2006/0024517 A1 * | 2/2006 | Doan | C23C 16/0227 428/469 |
| 2006/0093736 A1 | 5/2006 | Raybould et al. | |
| 2006/0234396 A1 | 10/2006 | Tomita et al. | |
| 2007/0012657 A1 | 1/2007 | O'Donnell et al. | |
| 2008/0029032 A1 | 2/2008 | Sun et al. | |
| 2008/0223725 A1 | 9/2008 | Han et al. | |
| 2008/0241517 A1 | 10/2008 | Kenworthy et al. | |
| 2008/0283408 A1 * | 11/2008 | Nishizawa | H05K 1/056 205/316 |
| 2009/0298251 A1 | 12/2009 | Choi et al. | |
| 2010/0155251 A1 | 6/2010 | Bogue et al. | |
| 2010/0170937 A1 | 7/2010 | Calla | |
| 2011/0020665 A1 | 1/2011 | Serafin et al. | |
| 2011/0206833 A1 | 8/2011 | Sexton et al. | |
| 2012/0008796 A1 | 1/2012 | Furge | |
| 2012/0103526 A1 | 5/2012 | Ouye et al. | |
| 2012/0138472 A1 | 6/2012 | Han et al. | |
| 2013/0008796 A1 * | 1/2013 | Silverman | C25D 7/00 205/50 |
| 2014/0110145 A1 * | 4/2014 | Elie | H01B 1/026 174/102 C |
| 2014/0272459 A1 | 9/2014 | Daugherty et al. | |
| 2015/0337450 A1 | 11/2015 | Shih et al. | |
| 2015/0376810 A1 * | 12/2015 | Browning | C25D 11/04 205/50 |

FOREIGN PATENT DOCUMENTS

| | | |
|---|---|---|
| JP | 2009-099853 A | 5/2009 |
| KR | 10-2006-0111201 A | 10/2006 |
| KR | 10-2007-0001722 | 1/2007 |
| KR | 10-2012-0077375 A | 7/2012 |

OTHER PUBLICATIONS

Ohgai et al., "Template Synthesis and Magnetoresistance Property of Ni and Co Single Nanowires Electrodeposited into Nanopores with a Wide Range of Aspect Ratios," J. Phys. D: Appl. Phys. (no month, 2006), vol. 36, pp. 3109-3114.*

Tan et al., "High Aspect Ratio Microstructures on Porous Anodic Aluminum Oxide," IEEE (no month, © 1995), pp. 267-272.*

Paredes et al., "The Effect of Roughness and Pre-Heating of the Substrate on the Morphology of Aluminum Coatings Deposited by Thermal Spraying," Surface & Coatings Technology (no month, 2006), vol. 200, pp. 3049-3055.*

International Search Report & Written Opinion of the International Searching Authority dated Dec. 4, 2014, in International Application No. PCT/US2014/052104.

* cited by examiner

702

704

706

US 9,624,593 B2

ANODIZATION ARCHITECTURE FOR ELECTRO-PLATE ADHESION

RELATED APPLICATIONS

This application claims the benefit of U.S. Provisional Application Ser. No. 61/871,807 filed on Aug. 29, 2013, which is hereby incorporated by reference.

TECHNICAL FIELD

Embodiments of the present disclosure relate, in general, to aluminum coated articles and to a process for applying an aluminum coating to a substrate.

BACKGROUND

In the semiconductor industry, devices are fabricated by a number of manufacturing processes producing structures of an ever-decreasing size. Some manufacturing processes such as dry etch may generate particles and metal contamination on the substrate that is being processed, contributing to device defects. As device geometries shrink, susceptibility to these defects increases, and particle and metal contamination requirements become more stringent. Accordingly, as device geometries shrink, allowable levels of particle defects and metal contamination may be reduced significantly.

SUMMARY

In one embodiment, a first anodization layer with a thickness greater than about 100 nm is formed on a metallic article that includes impurities and inclusions, and an aluminum coating substantially free from impurities and inclusions is formed on the first anodization layer, the aluminum coating being substantially free from impurities.

The aluminum coating can have a thickness in a range from about 20 microns to about 80 microns. The anodized metallic article may not undergo deionized water sealing (DI sealing) post anodization. The anodized metallic article can be heated to a temperature in a range from about 60 degrees C. to about 150 degrees C. for a time in a range from about 2 hours to about 12 hours prior to the aluminum coating being formed on the anodization layer. A second anodization layer can be formed on the aluminum coating and can have a thickness in a range from about 5 microns to about 30 microns. An average surface roughness (Ra) of the metallic article prior to anodization can be in a range from about 15 micro-inch to about 300 micro-inch.

A composite ceramic layer can be formed on the aluminum coating and can have a thickness in a range from about 50 microns to about 300 microns. The article can be Al 6061. The aluminum coating can be electroplated on the article.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
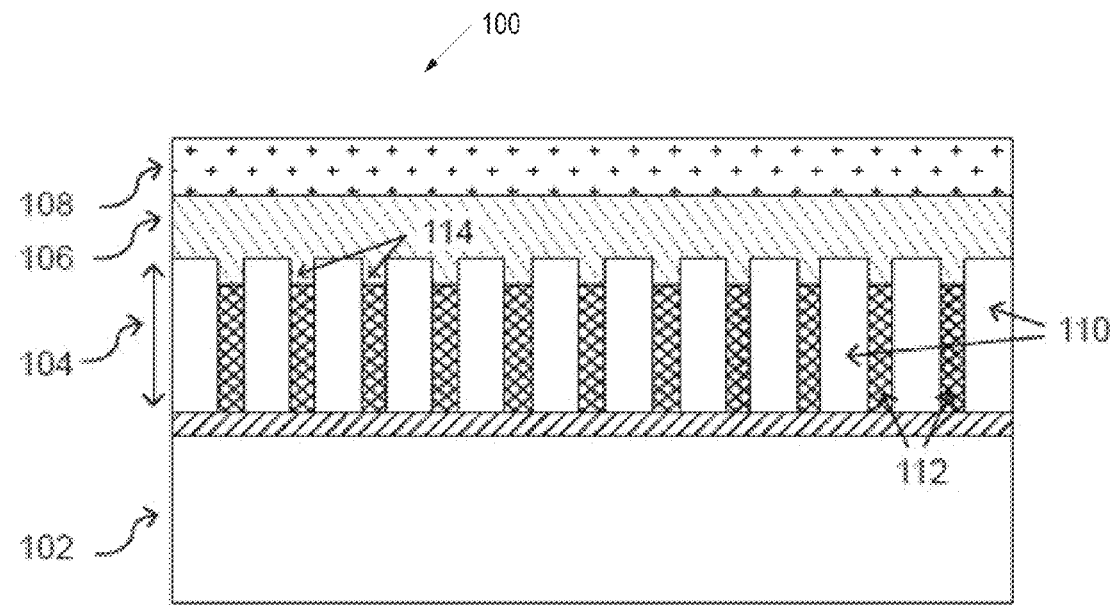
FIG. 1 illustrates a chamber component for use in a semiconductor manufacturing chamber, in accordance with one embodiment of the present invention.

Embodiments of the disclosure are directed to a process for anodizing an article (e.g., an article for use in semiconductor manufacturing) to form an anodization layer of a certain thickness (e.g., greater than about 100 nm) and coating the article with an aluminum coating, and to an article created using such a coating process. For example, the article may be a showerhead, a cathode sleeve, a sleeve liner door, a cathode base, a chamber liner, an electrostatic chuck base, etc. of a chamber for processing equipment such as an etcher, a cleaner, a furnace, and so forth. In one embodiment, the chamber is for a plasma etcher or plasma cleaner. In one embodiment, these articles can be formed of an aluminum alloy (e.g., Al 6061), another alloy, a metal, a metal oxide, or any other suitable material (e.g., a conductive material). In one embodiment, a composite ceramic layer can be formed over the aluminum coating.

Due to impurities in the metals used to manufacture semiconductor chamber components (e.g., Al 6061), these components may not meet some semiconductor manufacturing specifications. For example, metal contamination specifications for device nodes having sizes of less than 90 nm may be stringent. These impurities can leach out of typical coated or anodized articles during plasma processing of a wafer and increase contamination levels. However, pure aluminum may not be a suitable material for manufacture of these components due to lower structural strength. Also, substantially pure aluminum coated on typical anodization microstructures may have low adhesion (e.g., less than about 10 MPa) due to a low aspect ratio of anodization column height to gap diameter (also referred to as pore diameter) between anodization columns. This may lead to a low shear resistance of the aluminum coating. Further, anodization can result in sufficient moisture retention between anodization columns to create a sealing layer. Such a sealing layer reduces infiltration of the successive pure aluminum into the gaps or pores between the anodization columns, leading to further reduced adhesion of the aluminum coating. According to embodiments, parameters for anodization of these components (e.g., a thickness of an anodization layer) may be optimized to reduce metal contamination from the article and increase adhesion of an aluminum coating. One such example parameter for anodization is a thickness of an anodization layer. Performance properties of the article may include a relatively long lifespan, and a low on-wafer metal contamination, according to embodiments.

Embodiments described herein may cause reduced on wafer metal contamination when used in a process chamber for plasma rich processes. However, it should be understood that the aluminum coated articles discussed herein may also provide reduced metal contamination when used in process chambers for other processes such as non-plasma etchers, non-plasma cleaners, chemical vapor deposition (CVD) chamber, physical vapor deposition (PVD) chamber, and so forth.

When the terms "about" and "approximately" are used herein, these are intended to mean that the nominal value presented is precise within ±10%. The articles described herein may be other structures that are exposed to plasma.

FIG. 1 illustrates a cross-sectional view of a chamber component 100 for use in a semiconductor manufacturing chamber, in accordance with one embodiment of the present invention. The chamber component 100 includes an article 102, an anodization layer 104, an aluminum coating 106, and a second anodization layer 108. The chamber component 100 shown is for representational purposes and is not necessarily to scale.

The article 102 can be a semiconductor chamber component, which are typically manufactured of aluminum alloys (e.g., 6061 Al). However, the article 102 can also be formed of any other suitable material, such as other metals or metal alloys. According to embodiments, the article can be a showerhead, a cathode sleeve, a sleeve liner door, a cathode base, a chamber liner, an electrostatic chuck base, etc. of a chamber for processing equipment such as an etcher, a cleaner, a furnace, and so forth.

In one embodiment, the surface roughness of the article 102 is in a range from about 15 micro-inches to about 300 micro-inches (e.g., about 120 micro-inches). The article 102 may have been initially formed such that the surface roughness is in the above range. However, the surface roughness of the article 102 can be adjusted by either reducing the surface roughness (e.g., by polishing or sanding) or increasing the surface roughness (e.g., by bead blasting or grinding). The surface roughness can be optimized for different applications, such as different locations of the article within the semiconductor manufacturing chamber.

The article 102 is anodized (e.g., via oxalic anodization) to form the anodization layer 104 on a surface of the article 102, where pores 112 are formed between anodization columns 110 formed of $Al_2O_3$. The anodization layer 104 can be formed to have a certain thickness that results in an aspect ratio of the anodization column 110 height to the pore diameter being in a range from about 10 to 1 (10:1) to about 2000 to 1 (2000:1). Such aspect ratios may ensure pores 112 that are suitably deep in some embodiments. For example, pore diameter is typically in a range from about 10 nm to about 50 nm (e.g., about 30 nm), so an aspect ratio of 10 to 1 would result in the anodization layer 104 having a thickness of about 300 nm. In another example, an aspect ratio of 2000 to 1 would result in the anodization layer 104 having a thickness of about 60 microns. The formation of the anodization layer 104 will be discussed below in greater detail.

A standard final step in the anodization process is to perform deionized water (DI) sealing. DI sealing is a process in which an anodized part is immersed into deionized water (e.g., hot DI water at about 96-100° C.) to form hydrated aluminum oxide (boehmit) in columnar pores of the anodization layer. DI sealing is performed to close or seal the columnar structure (e.g., the pores) of the anodization layer. Without a high quality sealing, the anodization layer (anodic coating) may be highly absorbent of dirt, grease, oils and stains. Typically the DI sealing is performed to give a maximum corrosion resistance. However, in embodiments the DI sealing process is omitted to enable a subsequent high purity coating to anchor to the columnar pores and provide good adhesion.

The aluminum coating 106 can then be formed (e.g., via electroplating or any other suitable method) over the anodization layer 104. As mentioned, in one embodiment deionized water (DI) sealing is not performed prior to forming the aluminum coating 106 so that moisture is not added to the pores 112. Further, the article 102 with the anodization layer 104 can be baked to further remove moisture from the pores 112, according to one embodiment. Such baking may be for a time in a range from about 2 to about 12 hours at a temperature in a range from about 60 degrees C. to about 150 degrees C.). For example, the article 102 with the anodization layer 104 can be baked for about 6 hours at about 95 degrees C. The formation of the aluminum coating 106 will be discussed below in greater detail.

As the aluminum coating 106 is formed on the anodization layer 104, portions 114 of the aluminum coating 106 can infiltrate the pores 112. Because the pores 112 are suitably deep and are not otherwise blocked by moisture, the portions 114 of the aluminum coating 106 that infiltrate into the pores 112 are long enough to suitably adhere the aluminum coating 106 to the anodization layer 104. As a result, the adhesion of the aluminum coating 106 to the article is improved over typical aluminum coatings. In one embodiment, the thickness of the aluminum coating can be in a range from about 20 microns to about 80 microns (e.g., about 50 microns).

In one embodiment, the aluminum coating 106 can be anodized to form a second anodization layer 108 formed of $Al_2O_3$ from the aluminum coating 106, in a manner similar to the anodization described above. The second anodization layer 108 can protect the aluminum coating 106 from wear and tear during use of the chamber component 100. Further, as a result of having a pure aluminum coating (e.g., an ultra-pure Al coating), the second anodization layer 108 is relatively pure. Therefore, exposure to plasma chemistry will result in less metal contamination. Also, the second anodization layer 108 is more plasma-resistant than bare aluminum. In one embodiment, the thickness of the second anodization layer 108 can be in a range from about 5 microns to about 30 microns. However, this second anodization layer 108 can be optional. The range of adhesion strength can be between from about 5 to about 100 MPa.

In one embodiment, a ceramic layer can be formed over the aluminum coating 106 or the second anodization layer 108. The ceramic layer can be a ceramic composite layer formed of any suitable material such as an $Y_2O_3$, $Al_2O_3$, $ZrO_2$ or a mixture of these metal oxides. The ceramic layer can have a thickness in a range from about 100 microns to about 300 microns (e.g., in a range from about 200 microns to about 250 microns). Alternatively, the ceramic layer may have a thickness of about 2-10 microns in one embodiment. The ceramic composite layer can help to protect the chamber component 100, and can improve particle performance of the component.

Figure 2:
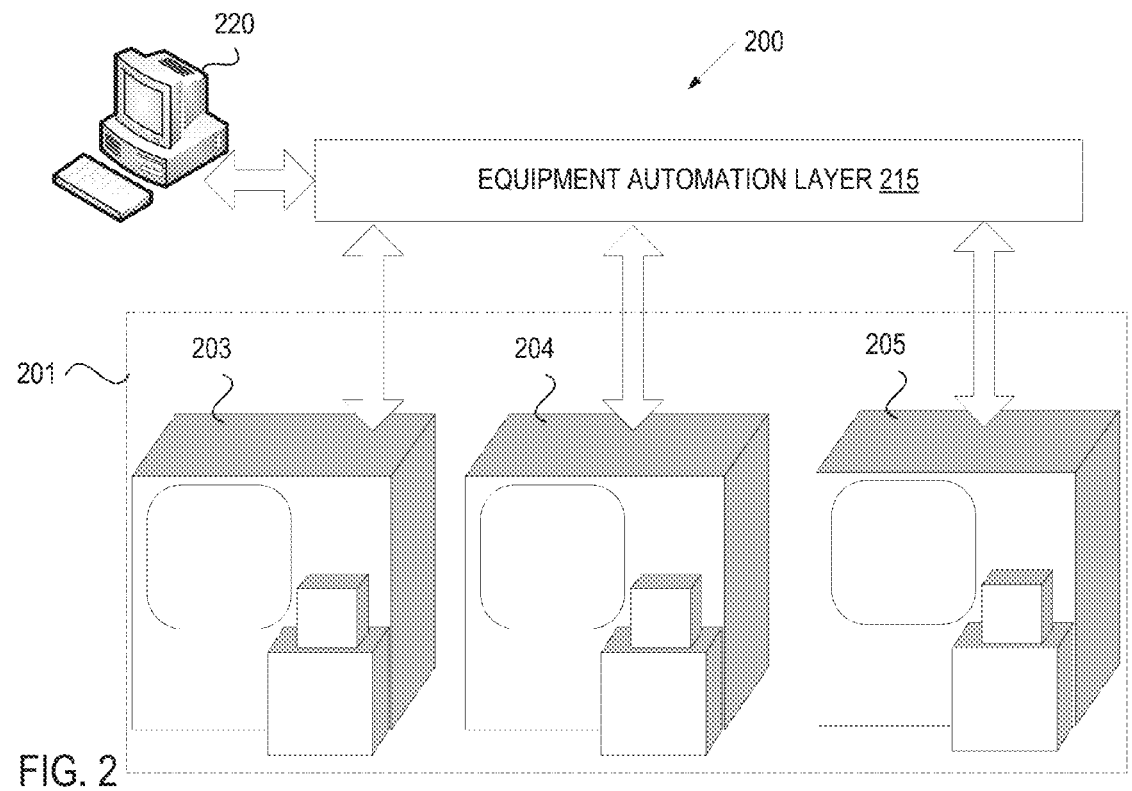
FIG. 2 illustrates an exemplary architecture of a manufacturing system, in accordance with one embodiment of the present invention.

FIG. 2 illustrates an exemplary architecture of a manufacturing system 200 for manufacturing a chamber component (e.g., chamber component 100 of FIG. 1). The manufacturing system 200 may be a system for manufacturing an article for use in semiconductor manufacturing. In one embodiment, the manufacturing system 200 includes processing equipment 201 connected to an equipment automation layer 215. The processing equipment 201 may include a bead blaster 203, an aluminum coater 204 and/or an anodizer 205. The manufacturing system 200 may further include one or more computing devices 220 connected to the equipment automation layer 215. In alternative embodiments, the manufacturing system 200 may include more or fewer components. For example, the manufacturing system 200 may include manually operated (e.g., off-line) processing equipment 201 without the equipment automation layer 215 or the computing device 220.

The bead blaster 203 can adjust a surface roughness of an article prior to any layers or coatings being formed. For example, the bead blaster 203 may adjust a surface roughness of the article to be in a range from about 15 micro-inches to about 300 micro-inches (e.g., about 120 micro-inches). In other embodiments, the surface roughness of the article may be increased by grinding, or may be decreased by sanding or polishing. However, the surface roughness of the article may already be suitable, so surface roughness adjustment can be optional. Surface roughness adjustment will be described in greater detail below.

In one embodiment, a wet cleaner cleans the article using a wet clean process where the article is immersed in a wet bath (e.g., after surface roughness adjustment or prior to coatings or layers being formed). In other embodiments, alternative types of cleaners such as dry cleaners may be used to clean the articles. Dry cleaners may clean articles by applying heat, by applying gas, by applying plasma, and so forth. In one embodiment, the article is not cleaned in a wet cleaner (not shown) after anodization to form an anodization layer. Furthermore, after anodization, the article can be baked in a heating apparatus (e.g., an oven) for certain period (e.g., 2 hours to 12 hours) at a certain temperature (e.g., 60 degrees C. to 150 degrees C.) to remove residual moisture from the article and/or the anodization layer.

In one embodiment, anodizer 205 is a system configured to form an anodization layer on the aluminum coating. For example, the article (e.g., a conductive article) is immersed in an anodization bath, e.g., including sulfuric acid, oxalic acid, phosphoric acid, or a mixture of these acids and an electrical current is applied to the article such that the article is an anode. The anodization layer then forms on the aluminum coating on the article, which will be described in more detail below.

In one embodiment, the article is not cleaned in a wet cleaner after anodization to form an anodization layer. Furthermore, after anodization, the article can be baked in a heating apparatus (e.g., an oven) for certain period (e.g., 2 hours to 12 hours) at a certain temperature (e.g., 60 degrees C. to 150 degrees C.) to remove residual moisture from the article and/or the anodization layer.

Aluminum coater 204 is a system configured to apply an aluminum coating to the surface of the article. In one embodiment, aluminum coater 204 is an electroplating system that plates the aluminum on the article (e.g., a conductive article) by applying an electrical current to the article when the article is immersed in an electroplating bath including aluminum, which will be described in more detail below. Here, surfaces of the article can be coated evenly because the conductive article is immersed in the bath. In alternative embodiments, the aluminum coater 204 may use other techniques to apply the aluminum coating such as physical vapor deposition (PVD), chemical vapor deposition (CVD), twin wire arc spray, ion vapor deposition, sputtering, and cold spray. The formation of the aluminum coating will be described in more detail below.

The equipment automation layer 215 may interconnect some or all of the manufacturing machines 201 with computing devices 220, with other manufacturing machines, with metrology tools and/or other devices. The equipment automation layer 215 may include a network (e.g., a location area network (LAN)), routers, gateways, servers, data stores, and so on. Manufacturing machines 201 may connect to the equipment automation layer 215 via a SEMI Equipment Communications Standard/Generic Equipment Model (SECS/GEM) interface, via an Ethernet interface, and/or via other interfaces. In one embodiment, the equipment automation layer 215 enables process data (e.g., data collected by manufacturing machines 201 during a process run) to be stored in a data store (not shown). In an alternative embodiment, the computing device 220 connects directly to one or more of the manufacturing machines 201.

In one embodiment, some or all manufacturing machines 201 include a programmable controller that can load, store and execute process recipes. The programmable controller may control temperature settings, gas and/or vacuum settings, time settings, etc. of manufacturing machines 201. The programmable controller may include a main memory (e.g., read-only memory (ROM), flash memory, dynamic random access memory (DRAM), static random access memory (SRAM), etc.), and/or a secondary memory (e.g., a data storage device such as a disk drive). The main memory and/or secondary memory may store instructions for performing heat treatment processes described herein.

The programmable controller may also include a processing device coupled to the main memory and/or secondary memory (e.g., via a bus) to execute the instructions. The processing device may be a general-purpose processing device such as a microprocessor, central processing unit, or the like. The processing device may also be a special-purpose processing device such as an application specific integrated circuit (ASIC), a field programmable gate array (FPGA), a digital signal processor (DSP), network processor, or the like. In one embodiment, programmable controller is a programmable logic controller (PLC).

Figure 3:
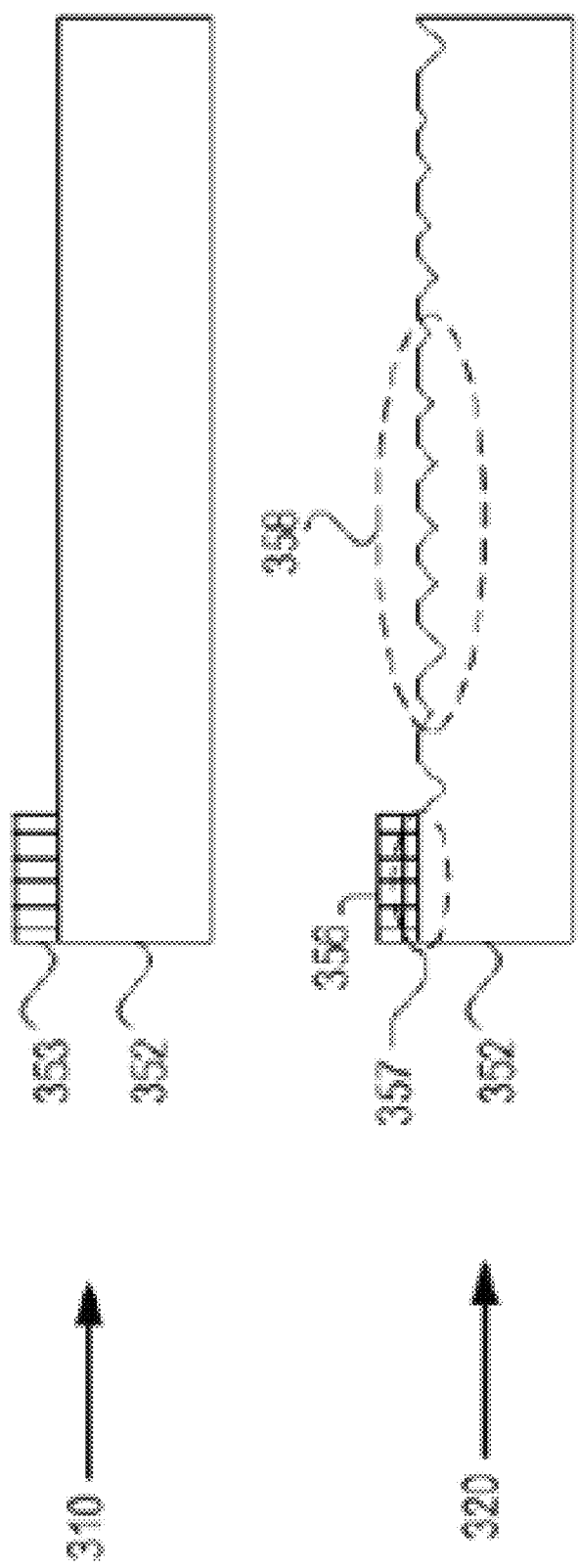
FIG. 3 illustrates cross-sectional side views of an article during different stages of a manufacturing process, in accordance with embodiments of the present invention.

FIG. 3 shows cross sectional side views 310 and 320 of an article during different stages of a manufacturing process, in accordance with embodiments of the present invention. In one embodiment, the cross sectional side views correspond to a state of chamber component 100 of FIG. 1 during preparation for anodization by adjusting a surface roughness.

Side view 310 shows a hard mask 353 disposed over a protected portion of a provided article. The provided article may have a metal body (e.g., formed of AL 6061). The hard mask 353 may prevent the protected portion from becoming roughened during bead blasting. The article is roughened by a bead blaster (or other ceramic roughener). In one embodiment, the bead blaster uses ceramic beads to blast a surface of the article. In one embodiment, the ceramic beads have a size range of approximately 0.2-2 mm. The bead blaster may bead blast the article with an air pressure of approximately 30-90 psi and a working distance of approximately 50-150 mm, and the blasting angle to the body should be about or slightly less than 90 degree. The bead blaster may roughen exposed portions of the body of the article (those portions not covered by the mask).

Side view 320 shows the article 352 after bead blasting has been performed. The article 352 has a roughened surface 358, corresponding to a portion of the article that was not protected during the bead blasting. The article 352 additionally has a smooth surface 357 corresponding to a portion of the article that has not been roughened. As shown, a soft mask 356 is disposed on the article 352 over the smooth surface 357 after the article 352 has been roughened. The soft mask 356 may be used to cover a same region of the article 352 that was previously protected by the hard mask 353. Side view 320 shows a state of the article after completion of block 212.

In one embodiment, a processed article has a post-blast roughness in a range from about 15 micro-inches to about 300 micro-inches. The post-blast roughness may be about 120 micro-inches in one embodiment. Roughening the article to an optimal roughness may improve adhesion strength of subsequent layers or coatings. However, in one embodiment, the article is not roughened.

Figure 4:
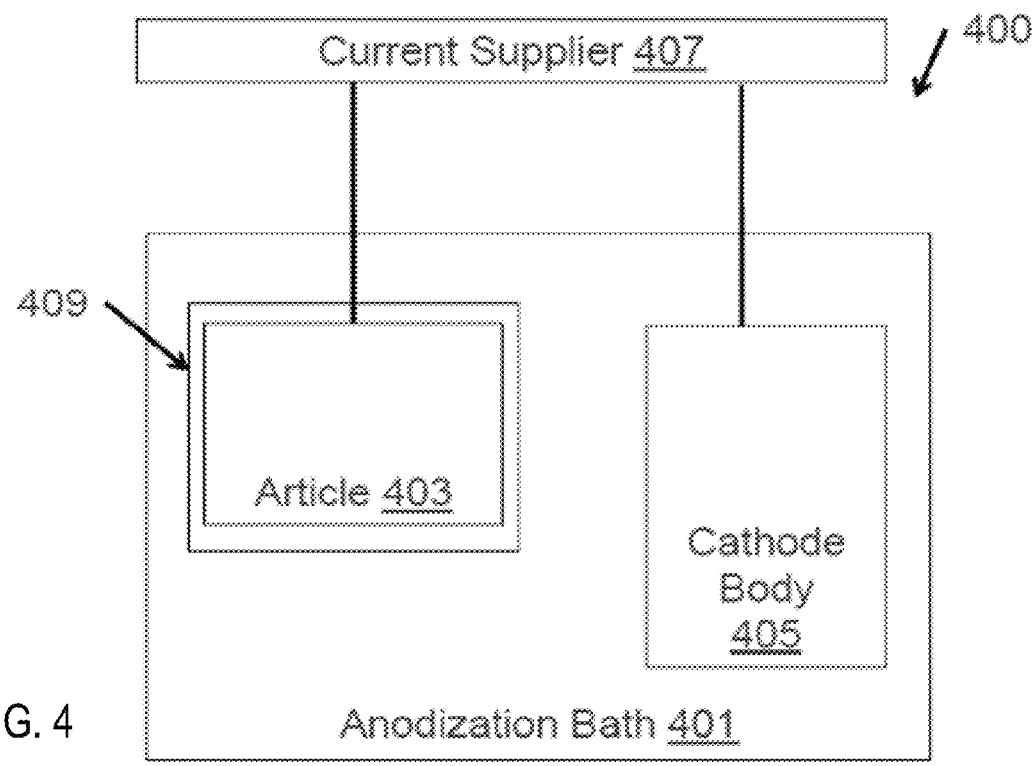
FIG. 4 illustrates a process for anodizing an article, in accordance with one embodiment of the present invention.

FIG. 4 illustrates a process 400 for anodizing an article 403 to form an anodization layer 409, according to one embodiment. For example, article 403 can be article 102 of FIG. 1. Anodization changes the microscopic texture of the surface of the article 403, thus FIG. 4 is for illustration purposes only and may not be to scale. Preceding the anodization process, the article 403 can be cleaned in a nitric acid bath, an alkaline solution, or NaOH, or subjected to a chemical treatment (e.g., deoxidation) prior to anodization.

The article 403 is immersed in an anodization bath 401, including an acid solution, along with a cathode body 405. Examples of cathode bodies that may be used include aluminum alloys such as Al6061 and Al3003 and carbon bodies. The anodization layer 409 is grown on the article 403 by passing a current through an electrolytic or acid solution via a current supplier 407 (e.g., a battery or other power supply). Here, the article 403 is the anode (the positive electrode). The current then releases hydrogen at the cathode body 405, e.g., the negative electrode, and oxygen at the surface of the article 403 to form an anodization layer 409 of aluminum oxide. In embodiments, the voltage that enables anodization using various solutions may range from 1 to 300 V or from 15 to 21 V. The anodizing current varies with the area of the cathode body 405 anodized, and can range from 30 to 300 amperes/meter$^2$ (2.8 to 28 ampere/ft$^2$).

The acid solution dissolves (e.g., consumes or converts) a surface of the article 403 (e.g., the aluminum coating) to form a coating of pores (e.g., columnar nano-pores). The anodization layer 409 then continues growing from this coating of nano-pores. The pores may have a diameter in a range from about 10 nm to about 50 nm (e.g., about 30 nm). The acid solution can be oxalic acid, phosphoric acid, sulfuric acid (Type III anodization), or a combination of these acids, and/or other acids. For oxalic acid, the ratio of consumption of the article to anodization layer growth is about 1:1. Electrolyte concentration, acidity, solution temperature, and current are controlled to form a consistent aluminum oxide anodization layer 409 on the article 403. In one embodiment, the anodization layer 409 can be grown to have a thickness in a range from about 100 nm to about 60 microns.

In one embodiment, the current density is initially high to grow a very dense barrier layer portion of the anodization layer, and then current density is reduced to grow a porous columnar layer portion of the anodization layer. In one embodiment where oxalic acid is used to form the anodization layer, the porosity is in a range from about 40% to about 50%, and the pores have a diameter in a range from about 10 nm to about 50 nm.

In one embodiment, the average surface roughness (Ra) of the anodization layer is in a range from about 15 micro-inches to about 300 micro-inches, which can be similar to the initial roughness of the article. In one embodiment, the average surface roughness is about 120 micro-inches.

Figure 5:
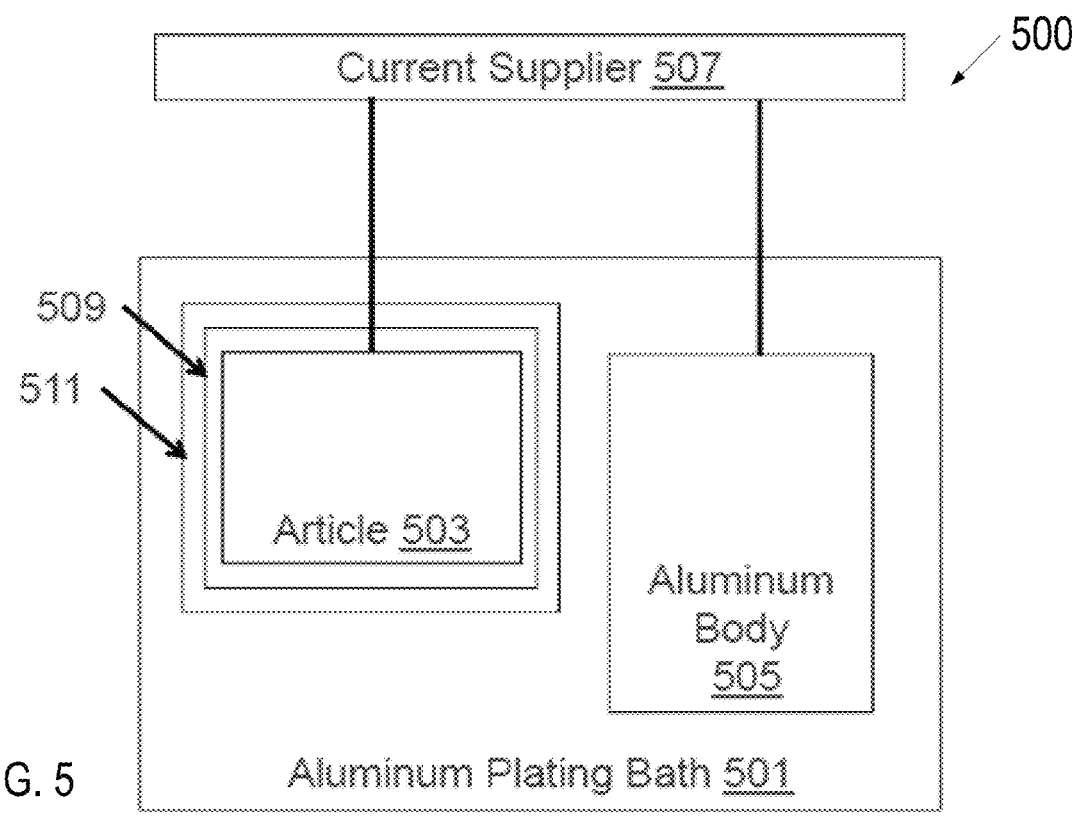
FIG. 5 illustrates a process for forming an aluminum coating on an article, in accordance with one embodiment of the present invention.

FIG. 5 illustrates a process 500 for electroplating an article 503 with an anodization layer 509 with an aluminum coating 511. In one embodiment, the article 503 is article 102 with anodization layer 104 from FIG. 1. Electroplating may produce an aluminum layer having a purity of 99.99. Electroplating is a process that uses electrical current to reduce dissolved metal cations to form a metal coating on an electrode, e.g., aluminum coating 511 on article 503 with anodization layer 509. The article 503 is the cathode, and an aluminum body 505 (e.g., high purity aluminum) is the anode. Both components are immersed in an aluminum plating bath 501 including an electrolyte solution containing one or more dissolved metal salts as well as other ions that permit the flow of electricity. A current supplier 507 (e.g., a battery or other power supply) supplies a direct current to the article 503. The direct current oxidizes the metal atoms of the aluminum body 505 such that the metal atoms dissolve in the solution. The dissolved metal ions in the electrolyte solution are reduced at the interface between the solution and the article 503 to plate onto the article 503 and form an aluminum coating 511 or aluminum plating layer. According to an embodiment, the metal ions also infiltrate the pores of the anodization layer 509 to form portions of the aluminum coating 511 that extend into the anodization layer 509. These portions of the aluminum coating 511 extend into the anodization layer 509 and help to improve adhesion of the aluminum coating 511 to the article 503 by better anchoring the aluminum coating through the high aspect ratio columnar structure of the base anodization.

In one embodiment, the aluminum coating 511 is smooth. For example, the aluminum plating may have an average surface roughness (Ra) of about 20 micro-inches to about 300 micro-inches.

In one embodiment, the aluminum coating 511 thickness is optimized for both cost savings and adequate thickness for contamination prevention. The thickness of the aluminum coating can be chosen such an anodization layer with a thickness in a range from about 25 to about 75 um can be formed from the aluminum coating without anodizing the entire aluminum coating. In one embodiment, the aluminum coating 511 has a thickness of in a range from about 20 microns to about 80 microns (e.g., about 50 microns in one embodiment). Note that other aluminum coating processes other than electroplating may also be used in other embodiments, such as high-velocity oxy-fuel spray (HVOF).

Figure 6:
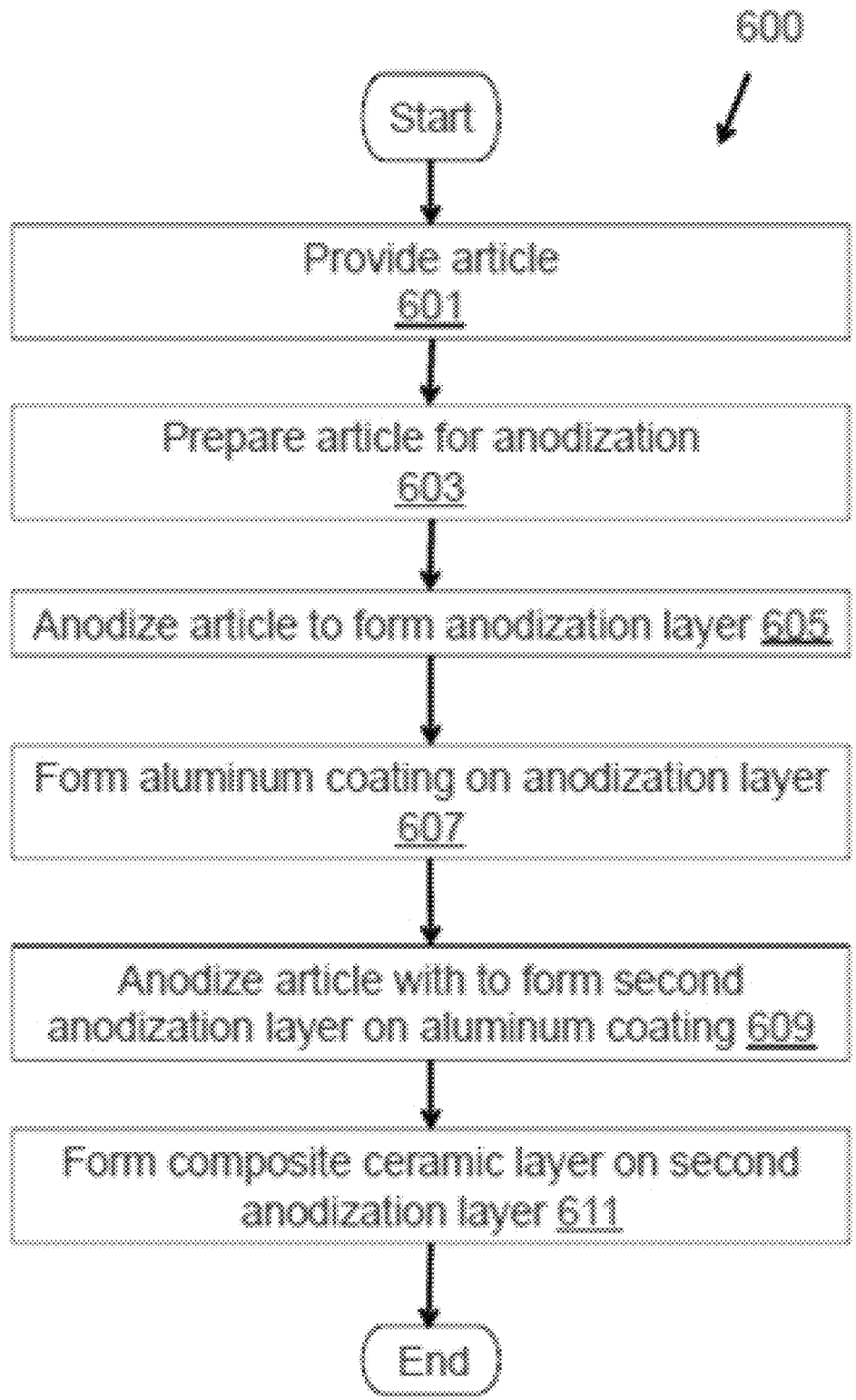
FIG. 6 is a flow chart showing a process for manufacturing an article, in accordance with embodiments of the present invention.

FIG. 6 is a flow chart showing a method 600 for manufacturing an aluminum coated article, in accordance with embodiments of the present disclosure. The operations of method 600 may be performed by various manufacturing machines, as set forth in FIG. 2.

At block 601, an article (e.g., an article having at least a conductive portion) is provided. For example, the article can be a conductive article formed of an aluminum alloy (e.g., Al 6061). The article can be a shower head, a cathode sleeve, a sleeve liner door, a cathode base, a chamber liner, an electrostatic chuck base, etc., for use in a processing chamber.

At block 603, the article is prepared for coating, according to one embodiment. The surface of the article may be altered by roughening, smoothing, or cleaning the surface.

At block 605, the article is anodized to form an anodization layer (e.g., formed of Al$_2$O$_3$), according to one embodiment. For example, the article can be anodized in a bath of oxalic acid or sulfuric acid, as similarly described with respect to FIG. 4, to form an anodization layer having a thickness in a range from about 300 nm to about 60 microns. In one embodiment, the article can be baked after anodization, as described above, to remove residual moisture from pores of the anodization layer.

At block 607, the article is coated (e.g., plated) with an aluminum coating (e.g., a substantially pure aluminum coating). For example, the article can be electroplated with aluminum, as similarly described with respect to FIG. 5, to form an aluminum coating having a thickness in a range from about 20 microns to about 80 microns. In other examples, the coating can be applied by physical vapor deposition (PVD), chemical vapor deposition (CVD), twin wire arc spray, ion vapor deposition, sputtering, and cold spray.

At block 609, the article is anodized to form a second anodization layer on the aluminum coating, according to one embodiment. The second anodization layer (e.g., formed of $Al_2O_3$ as described above) can have a thickness in a range from about 5 microns to about 30 microns. However, this second anodization layer can be optional.

At block 611, the article is coated with a plasma resistant ceramic layer, according to one embodiment. A side of the article that will be exposed to a plasma environment may be coated. In one embodiment, a plasma sprayer is used to plasma spray the ceramic coating onto the article. In one embodiment, portions of the article that are not to be coated are masked prior to coating. However, this ceramic layer can be optional.

In one embodiment, mixed raw ceramic powders are sprayed onto the article. The article may be heated to a temperature of approximately 50-70° C. during the plasma spraying. In one embodiment, a plasma power of approximately 35-36.5 Watts (W) is used to plasma spray the article, though other plasma powers may also be used. The plasma spray process may be performed in multiple spray passes. In one embodiment, approximately 35-40 spray passes are applied to create a ceramic coating. In one example, the coating can have a thickness of approximately 5-50 mil.

In one embodiment, the ceramic coating is an yttrium oxide containing ceramic or other yttrium containing oxide deposited on the ceramic body using a thermal spraying technique (e.g., a plasma spraying technique). Thermal spraying techniques (e.g., plasma spraying techniques) may melt materials (e.g., ceramic powders) and spray the melted materials onto the article. The thermally sprayed or plasma sprayed composite ceramic layer may have a thickness in a range from about 100 microns to about 300 microns (e.g., a thickness in a range from about 200 microns to about 250 microns).

In one embodiment, the ceramic coating is produced from raw ceramic powders of $Y_2O_3$, $Al_2O_3$ and $ZrO_2$ that are mixed together. These raw ceramic powders may have a purity of 99.9% or greater in one embodiment. The raw ceramic powders may be mixed using, for example, ball milling. The raw ceramic powders may have a powder size of approximately 0.5-5 μm. In one embodiment, the raw ceramic powders have a powder size of approximately 1 μm. After the ceramic powders are mixed, they may be calcinated at a calcination temperature of approximately 1200-1600° C. (e.g., 1400° C. in one embodiment) and a calcination time of approximately 5-10 days (e.g., 3 days in one embodiment). The spray dried granular particle size for the mixed powder may have a size distribution of approximately 3-50 μm. In one embodiment, the median size is about 15 um. In another embodiment, the median size is about 25 um.

Additionally, the ceramic coating may have an adhesion strength of approximately 4-25 MPa (e.g., greater than approximately 14 MPa in one embodiment). Adhesion strength may be determined by applying a normal force (e.g., measured in megapascals) to the ceramic coating until the ceramic coating peels off from the article.

Figure 7A:
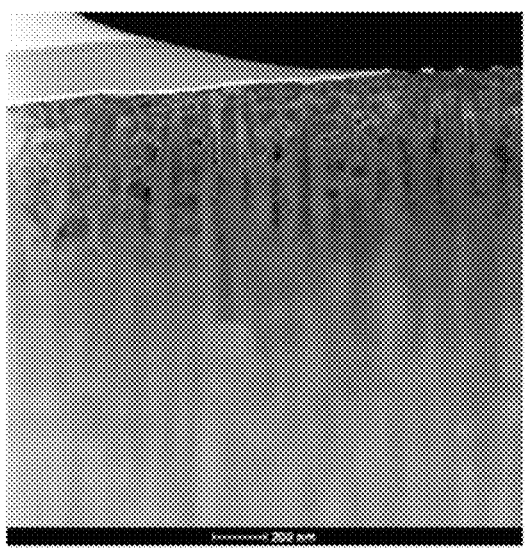
FIGS. 7A, 7B, and 7C illustrate additional cross-sectional micrograph views of layers on an article, in accordance with embodiments of the present invention.
Figure 7B:
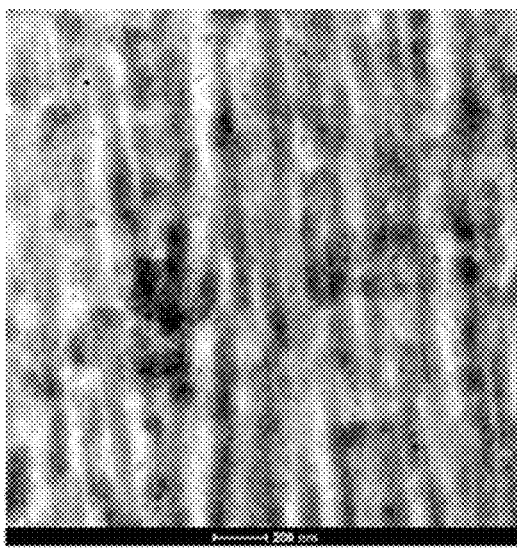
Figure 7C:
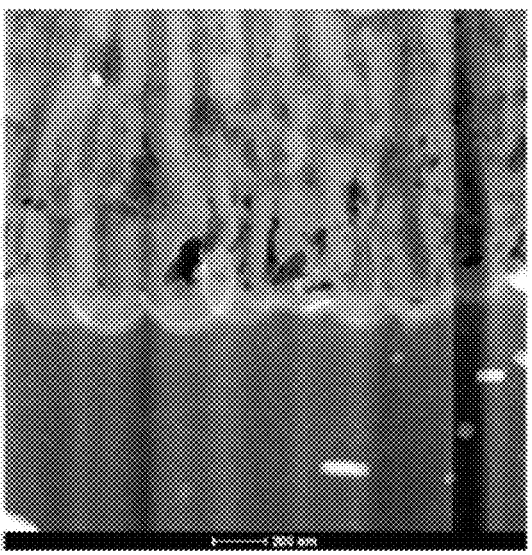

The article may then be tested for particles. Measured parameters that represent particle count are a tape peel test particle count and a liquid particle count (LPC). A tape test may be performed by attaching an adhesive tape to the ceramic coating, peeling the tape off, and counting a number of particles that adhere to the tape. The LPC may be determined by placing the article in a water bath (e.g., a de-ionized (DI) water bath) and sonicating the water bath. A number of particles that come off in the solution may then be counted using, for example, a laser counter. FIGS. 7A, 7B, and 7C illustrate scanning electron micrographs 702, 704, and 706, respectively, of cross-sectional views of Al6061 articles with an anodization layer formed in an oxalic acid bath with a 200 nm scale. The pores have a diameter of about 30 nm.

Table 1 shows an example of electroplated aluminum coating adhesion test results according to an embodiment, where adhesion strength of samples with various anodization layer types and thicknesses was measured. Test coupons were fabricated with a base anodization layer type of either oxalic or type III, where the base anodization layer thickness was varied between 0.3 um, 3 um and 10 um for each anodization layer type. To improve electroplated layer adhesion, there was no deionized water sealing of the test coupons post anodization. The coupons were subsequently electroplated with a high purity Aluminum layer with a thickness of about 50 microns. The coupons were then anodized to form either an oxalic or type III anodization layer with thicknesses that varied between 10 um and 30 um for each anodization type. An adhesion test was then performed per ASTM633C, where the test coupons were glued to an unprocessed coupon using high strength adhesive, and then the test coupon and the unprocessed coupon were pulled apart. The failure force needed to pull the coupons apart was measured as the adhesion strength, where, in an example, an adhesion strength of 30 MPa can be a threshold strength for desired performance.

TABLE 1

Coating Adhesion Test Results

|  | Oxalic second anodization layer with 10 micron thickness | Oxalic second anodization layer with 30 micron thickness | Type III second anodization layer with 10 micron thickness | Type III second anodization layer with 30 micron thickness |
| --- | --- | --- | --- | --- |
| Oxalic first anodization layer with 0.3 micron thickness | 36 MPa | 35 MPa | 37 MPa | 35 MPa |
| Oxalic first anodization layer with 3.0 micron thickness | 37 MPa | 38 MPa | 33 MPa | 32 MPa |
| Oxalic first anodization layer with 10 micron thickness | 31 MPa | 33 MPa | 34 MPa | 29 MPa |
| Type III first anodization layer with 0.3 micron thickness | 25 MPa | 24 MPa | 26 MPa | 28 MPa |
| Type III first anodization layer with 3.0 micron thickness | 32 MPa | 31 MPa | 34 MPa | 33 MPa |

TABLE 1-continued

Coating Adhesion Test Results

|  | Oxalic second anodization layer with 10 micron thickness | Oxalic second anodization layer with 30 micron thickness | Type III second anodization layer with 10 micron thickness | Type III second anodization layer with 30 micron thickness |
|---|---|---|---|---|
| Type III first anodization layer with 10 micron thickness | 31 MPa | 29 MPa | 35 MPa | 34 MPa |

Table 2 shows another example of electroplated aluminum coating adhesion test results according to an embodiment, where the procedures used were similar to those described above for Table 1, to demonstrate the repeatability of the test results.

TABLE 2

Coating Adhesion Test Results

|  | Oxalic second anodization layer with 10 micron thickness | Oxalic second anodization layer with 30 micron thickness | Type III second anodization layer with 10 micron thickness | Type III second anodization layer with 30 micron thickness |
|---|---|---|---|---|
| Oxalic first anodization layer with 0.3 micron thickness | 33 MPa | 35 MPa | 35 MPa | 35 MPa |
| Oxalic first anodization layer with 3.0 micron thickness | 36 MPa | 36 MPa | 35 MPa | 35 MPa |
| Oxalic first anodization layer with 10 micron thickness | 34 MPa | 33 MPa | 34 MPa | 35 MPa |
| Type III first anodization layer with 0.3 micron thickness | 22 MPa | 30 MPa | 25 MPa | 27 MPa |
| Type III first anodization layer with 3.0 micron thickness | 36 MPa | 34 MPa | 25 MPa | 35 MPa |
| Type III first anodization layer with 10 micron thickness | 34 MPa | 32 MPa | 35 MPa | 35 MPa |

Table 3 shows another example of electroplated aluminum coating adhesion test results according to an embodiment, where the procedures used were similar to those described above for Table 1, except that the test coupons were subjected to a vacuum bake test at about 130 degrees C. for about 20 hours to simulate actual chamber conditions. The results of Table 3 indicate that adhesion was maintained post-vacuum bake, which could indicate suitability for use with a semiconductor manufacturing chamber.

TABLE 3

Coating Adhesion Test Results

|  | Oxalic second anodization layer with 10 micron thickness | Oxalic second anodization layer with 30 micron thickness | Type III second anodization layer with 10 micron thickness | Type III second anodization layer with 30 micron thickness |
|---|---|---|---|---|
| Oxalic first anodization layer with 0.3 micron thickness | 33 MPa | 35 MPa | 35 MPa | 35 MPa |
| Oxalic Base first anodization layer with 3.0 micron thickness | 36 MPa | 33 MPa | 36 MPa | 35 MPa |
| Oxalic first anodization layer with 10 micron thickness | 36 MPa | 35 MPa | 36 MPa | 34 MPa |
| Type III first anodization layer with 0.3 micron thickness | 23 MPa | 23 MPa | 22 MPa | 24 MPa |
| Type III first anodization layer with 3.0 micron thickness | 36 MPa | 33 MPa | 34 MPa | 24 MPa |
| Type III first anodization layer with 10 micron thickness | 36 MPa | 33 MPa | 34 MPa | 33 MPa |

Table 4 shows test results of a visual inspection of samples processed according to the procedures described with respect to Table 1, where "good" indicates uniformity of color, "ok" indicates some non-uniformity of color, and "bad" indicates non-uniformity of color. Uniformity of color can indicate uniformity in anodization finish.

TABLE 4

Coating Adhesion Test Results

|  | Oxalic second anodization layer with 10 micron thickness | Oxalic second anodization layer with 30 micron thickness | Type III second anodization layer with 10 micron thickness | Type III second anodization layer with 30 micron thickness |
|---|---|---|---|---|
| Oxalic first anodization layer with 0.3 micron thickness | good | good | ok | ok |
| Oxalic Base first anodization layer with 3.0 micron thickness | good | good | bad | bad |
| Oxalic first anodization layer with 10 micron thickness | bad | bad | bad | bad |
| Type III first anodization layer with 0.3 micron thickness | good | good | good | good |
| Type III first anodization layer with 3.0 micron thickness | good | good | bad | bad |
| Type III first anodization layer with 10 micron thickness | bad | bad | bad | bad |

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or."

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method of manufacturing a chamber component for a processing chamber comprising:
   anodizing a metallic article comprising impurities to form a first anodization layer, wherein the first anodization layer has a plurality of pores and a thickness greater than about 100 nm, and wherein anodizing the metallic article comprises:
      initially using a first current density for the anodizing to grow a dense barrier layer portion of the anodization layer; and
      subsequently using a lower second current density for the anodizing to grow a porous columnar layer portion of the anodization layer;
   heating the metallic article comprising the first anodization layer to a temperature in a range from about 95 degrees C. to about 150 degrees C. for a time to remove moisture from the plurality of pores; and
   forming an aluminum coating on the first anodization layer after the heating, the aluminum coating being substantially free from impurities.

2. The method of claim 1, wherein the aluminum coating has a thickness in a range from about 20 microns to about 80 microns.

3. The method of claim 1, wherein the time is in a range from about 2 hours to about 12 hours, and wherein a wet clean process is not performed on the metallic article between the anodizing and the heating.

4. The method of claim 1 further comprising anodizing the aluminum coating to form a second anodization layer.

5. The method of claim 4, wherein the second anodization layer has a thickness in a range from about 5 microns to about 30 microns.

6. The method of claim 4 further comprising forming a ceramic layer on the second anodization layer.

7. The method of claim 6, wherein the ceramic layer has a thickness in a range from about 100 microns to about 1000 microns.

8. The method of claim 6, wherein the ceramic layer comprises at least one of $Y_2O_3$, $Al_2O_3$, $ZrO_2$, or a combination thereof.

9. The method of claim 4, wherein an adhesion strength of the aluminum coating is 23-37 MPa.

10. The method of claim 1, wherein a surface roughness of the metallic article prior to anodization is in a range from about 15 micro-inch to about 300 micro-inch.

11. The method of claim 1, wherein deionized water sealing is not performed subsequent to anodizing the metallic article.

12. The method of claim 1, wherein forming the aluminum coating comprises performing electroplating.

13. The method of claim 1, wherein the chamber component is selected from the group consisting of a showerhead, a cathode sleeve, a sleeve liner door, a cathode base, a chamber liner, and an electrostatic chuck base.

14. The method of claim 1, wherein the anodizing is performed via oxalic anodization.

15. The method of claim 1, wherein the first anodization layer has an aspect ratio of an anodization column height to a pore diameter in a range from about 10 to 1 to about 2000 to 1.

16. The method of claim 15, wherein the pore diameter of the first anodization layer is about 10-50 nm.

17. The method of claim 1, wherein portions of the aluminum coating infiltrate the plurality of pores in the first anodization layer.

18. The method of claim 1, wherein forming the aluminum coating comprises performing a high-velocity oxy-fuel spray (HVOF) process.

19. The method of claim 1, further comprising:
   roughening a surface of the metallic article prior to anodizing the metallic article.

* * * * *